United States Patent
Negami et al.

(10) Patent No.: US 7,071,496 B2
(45) Date of Patent: Jul. 4, 2006

(54) ELECTRONIC DEVICE AND METHOD FOR MANUFACTURING THE SAME

(75) Inventors: Takayuki Negami, Hirakata (JP); Yasuhiro Hashimoto, Soraku-gun (JP); Hironobu Inoue, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/700,290

(22) Filed: Nov. 3, 2003

(65) Prior Publication Data

US 2004/0089874 A1    May 13, 2004

(30) Foreign Application Priority Data

Nov. 6, 2002    (JP)    ............... 2002-322427

(51) Int. Cl.
*H01L 33/00*    (2006.01)
(52) U.S. Cl. .............. 257/103; 257/101; 257/183; 257/184; 257/509; 505/1
(58) Field of Classification Search .............. 505/1; 257/101, 183, 184, 609
See application file for complete search history.

(56) References Cited

U.S. PATENT DOCUMENTS

| | | | | | |
|---|---|---|---|---|---|
| 5,236,894 | A | * | 8/1993 | Tanaka et al. | 505/476 |
| 6,153,895 | A | * | 11/2000 | Watanabe et al. | 257/101 |
| 6,259,016 | B1 | | 7/2001 | Negami et al. | |
| 6,635,307 | B1 | * | 10/2003 | Huang et al. | 427/74 |

FOREIGN PATENT DOCUMENTS

JP    2000-323733    11/2000

* cited by examiner

*Primary Examiner*—David Nelms
*Assistant Examiner*—Mai-Huong Tran
(74) *Attorney, Agent, or Firm*—Hamre, Schumann, Mueller & Larson, P.C.

(57) ABSTRACT

An electronic device including a new oxide layer and a method for manufacturing the same are provided. The electronic device of the present invention includes an oxide layer, which is formed of an oxide containing an element from group IIa, an element from group IIb and an element from group IIIb. For example, it can be applied to a solar cell including a back electrode serving as a first electrode layer, a transparent electrically conductive film serving as a second electrode layer having a light-transmitting property, and a semiconductor layer that is provided between the back electrode and the transparent electrically conductive film and functions as a light-absorption layer, and including an oxide layer provided between the semiconductor layer and the transparent electrically conductive film.

7 Claims, 3 Drawing Sheets

ELECTRONIC DEVICE AND METHOD FOR MANUFACTURING THE SAME

BACKGROUND OF THE INVENTION

1. Field of the Invention

The present invention relates to an electronic device and a method for manufacturing the same. In particular, the present invention relates to a solar cell and a method for manufacturing the same, for example.

2. Description of Related Art

Oxide thin films containing an element from group IIa and an element from group IIb are used effectively for devices such as light-emitting elements and solar cells because they can be treated as a semiconductor and their band gap can be controlled by the content of the element from group IIa. In the present specification, each group is named according to an IUPAC short-form periodic table. Incidentally, group IIa and group IIb respectively correspond to group 2 and group 12 in an IUPAC long-form periodic table. In particular, the oxide thin films containing an element from group IIa and an element from group IIb are preferable as a window layer (sometimes referred to as a buffer layer instead) joined to a CIGS film in a thin-film solar cell using $CuInSe_2$ (CIS) or $Cu(In, Ga)Se_2$ (CIGS), which is a solid solution of CIS with Ga, as a light-absorption layer. CIS and CIGS are compound semiconductors (having a chalcopyrite structure) comprising at least one element from each of groups Ib, IIIb and VIb. Group Ib, group IIIb and group VIb respectively correspond to group 11, group 13 and group 16 in the long-form periodic table. An oxide thin film (a semiconductor thin film) containing an oxide of an element from group IIa and an element from group IIb, represented by $Zn_{1-x}Mg_xO$ disclosed in JP 2000-323733 A, is used effectively for increasing a conversion efficiency of a solar cell because its conduction band can be matched with that of the CIGS film by changing the content of the element from group IIa such as Mg.

Although the band gap can be controlled in the oxide thin film containing elements from groups IIa and IIb, it is difficult to control a valence band level because the group IIa has a predominant influence on the change in a conduction band level. On the other hand, in a material used in an electronic device, for example, a light-emitting element with a multiple well structure, it is important to control not only the conduction band level but also the valence band level. Further, in order to achieve various functions of the electronic device, an electrical conductivity (a carrier density) of the oxide thin film sometimes needs to be controlled.

Also, since the oxide thin film (semiconductor thin film) containing the oxide of an element from group IIa and an element from group IIb required as the window layer of the solar cell is insulative or highly resistive, it is necessary to use high-frequency sputtering as a manufacturing method. In general, when an insulating layer or a high-resistance film is formed by high-frequency sputtering, there is a disadvantage of slow film forming speed. Particularly, the solar cell has to be manufactured in a large area and at a high speed, and the speed of forming the window layer may determine the speed of the solar cell manufacturing process, serving as a factor limiting the production capacity.

SUMMARY OF THE INVENTION

In light of the above, it is an object of the present invention to provide an electronic device including a new oxide layer and a method for manufacturing the same.

In order to achieve the above-mentioned object, an electronic device of the present invention includes an oxide layer, wherein the oxide layer is formed of an oxide containing an element from group IIa, an element from group IIb and an element from group IIIb.

Further, a manufacturing method of the present invention is a method for manufacturing an electronic device including an oxide layer. The method includes forming the oxide layer by sputtering using at least one target containing an oxide of an element from group IIa, an oxide of an element from group IIb and an oxide of an element from group IIIb.

DESCRIPTION OF THE PREFERRED EMBODIMENTS

Figure 1:
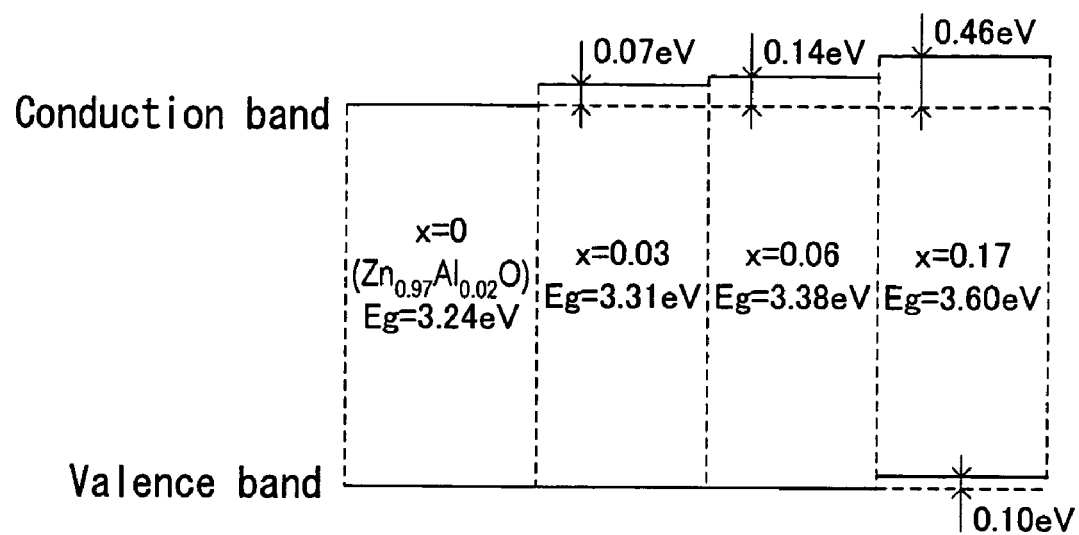
FIG. 1 shows the relationship between a band structure of a $Zn_{1-x}Mg_xO$ film and a Mg content x.

The above-described electronic device may include a first electrode layer, a second electrode layer having a light-transmitting property, and a semiconductor layer that is provided between the first electrode layer and the second electrode layer and functions as a light-absorption layer. The oxide layer may be provided between the semiconductor layer and the second electrode layer, and the above-described electronic device may function as a solar cell.

In the above-described electronic device, the element from group IIa in the oxide may be at least one element selected from the group consisting of Be, Mg, Ca, Sr and Ba, the element from group IIb in the oxide may be Zn, and the element from group IIIb in the oxide may be at least one element selected from the group consisting of B, Al, Ga and In. By using such an oxide, it is possible to control the band gap, the conduction band level and the valance band level of the oxide layer.

In the above-described electronic device, a composition ratio of the element from group IIIb in the oxide may be smaller than a sum of a composition ratio of the element from group IIa and that of the element from group IIb in the oxide. With this construction, it is possible to suppress a separation of the oxide layer into two or more phases.

In the above-described electronic device, a composition ratio of the element from group IIa in the oxide may be smaller than that of the element from group IIb in the oxide. With this construction, it is possible to suppress a separation of the oxide layer into two or more phases.

In the above-described electronic device, the oxide further may contain an element from group Vb. Group Vb corresponds to group 15 in the long-form periodic table. With this construction, the electrical conductivity of the oxide layer can be controlled easily.

In the above-described electronic device, the semiconductor layer may include a semiconductor whose main constituent elements are an element from group Ib, an element from group IIIb and an element from group VIb, and the semiconductor layer and the oxide layer may be layered.

In the above-described manufacturing method, the target may be a sintered body of the oxide of the element from group IIa, the oxide of the element from group IIb and the oxide of the element from group IIIb.

In the above-described manufacturing method, the sputtering may be carried out in an atmosphere containing a rare gas and oxygen. This makes it possible to form the oxide layer having a high specific resistance.

In the above-described manufacturing method, the sputtering may be carried out in an atmosphere containing at least one selected from the group consisting of a $H_2O$ (water) gas and a $D_2O$ (heavy water) gas. This makes it possible to raise the transmittance of light that has a smaller energy than the band gap of the oxide layer through the oxide layer.

In the above-described manufacturing method, the sputtering may be carried out in an atmosphere containing a nitrogen gas. This allows an easy control of the specific resistance of the oxide layer.

In the above-described manufacturing method, the sputtering may be direct-current sputtering. This makes it possible to form the oxide layer at a high speed.

The following is a description of embodiments of the present invention, with reference to the accompanying drawings. It should be noted that the present invention is not limited to the embodiments described herein.

First Embodiment

In a first embodiment, an example of an oxide constituting an oxide thin film (an oxide layer) used in the present invention (in the following, sometimes referred to as an oxide of the first embodiment) will be described first. The oxide of the first embodiment is an oxide containing at least one element from each of group IIa, group IIb and group IIIb. The element from group IIa can be at least one element selected from the group consisting of Be, Mg, Cr, Sr and Ba (in the following, sometimes referred to as element L). The element from group IIb can be at least one element selected from the group consisting of Zn and Cd (in the following, sometimes referred to as element M), for example, Zn. Further, the element from group IIIb can be at least one element selected from the group consisting of B, Al, Ga and In (in the following, sometimes referred to as element R). In the oxide of the first embodiment, main constituent elements besides oxygen are the element from group IIa, the element from group IIb and the element from group IIIb, and the content of elements other than oxygen, the element from group IIa, the element from group IIb and the element from group IIIb usually is not greater than 0.1 atomic %.

The following is a description of a specific example of the oxide of the present invention. The oxide of the present invention is, for example, an oxide containing the element L, the element M and the element R described above and represented by a composition formula $M_XL_YR_ZO$, wherein $0<X<1$, $0<Y<1$ and $0<Z<1$. Usually, $2X+2Y+3Z$ is equal to 2 or in the vicinity of 2. The value of $2X+2Y+3Z$ changes in the vicinity of 2 owing to an oxygen deficiency and the like. Here, it is preferable that the composition ratio of the element L from group IIa is smaller than that of the element M from group IIb (namely, $X>Y$). Also, it is preferable that the composition ratio of the element R from group IIIb is smaller than the sum of the composition ratio of the element L from group IIa and that of the element M from group IIb (namely, $Z<(X+Y)$). For example, X, Y and Z satisfying $0.4<X<1$, $0<Y<0.6$ and $0<Z<0.2$ are applicable.

Specific examples of the oxide represented by the composition formula $M_XL_YR_ZO$ noted above can include $Zn_XMg_YAl_ZO$, $Zn_XMg_YGa_ZO$, $Zn_XMg_YIn_ZO$ and $Zn_XMg_YB_ZO$. Each of the elements L, M and R may be plural elements as in $(Zn, Cd)_XMg_YAl_ZO$, $Zn_X(Be, Mg)_YAl_YO$ and $Zn_XMg_Y(Al, Ga)_ZO$. Furthermore, a slight amount of elements from group Vb (for example, N, P or N and P) may be added to these oxides (for example, $Zn_XMg_YAl_ZO:N$). The amount of the elements from group Vb to be added usually is not greater than 1 atomic %.

Hereinafter, as an exemplary property of the oxide used in the present invention, the property of an oxide using Mg for the element from group IIa, Zn for the element from group IIb and Al for the element from group IIIb will be described. First, an oxide thin film formed of an oxide $(Zn_{1-x}Mg_x)_{0.97}Al_{0.02}O$ containing 1 atomic % Al will be discussed. FIG. 1 shows the change in a band structure of the $(Zn_{1-x}Mg_x)_{0.97}Al_{0.02}O$ thin film with respect to a Mg content x. As shown in FIG. 1, a band gap Eg increases in keeping with the Mg content x. On the other hand, as x increases with respect to a conduction band level of $Zn_{0.97}Al_{0.02}O$ where $x=0$, the conduction band level rises (approaches to a vacuum level). Also, a valence band level does not change until $x=0.06$, but it also rises when x reaches 0.17. In such a system containing about 1 atomic % Al, the valence band level hardly changes. For example, even when a multiple quantum well including a ZnO layer and a $(Zn_{1-x}Mg_x)_{0.97}Al_{0.02}O$ layer is formed, an effect of confining holes in the valence band in the ZnO layer serving as the well is not produced, so that an efficiency of a quantum well laser lowers, for example. On the other hand, in the $Zn_xMg_yAl_zO$ thin film, the valence band level can be lowered (brought away from the vacuum level) by changing the Al content. For example, an increase in the Al content to 5 atomic % lowers the valence band level by about 0.1 eV. Thus, in the quantum well structure including the ZnO layer and a $Zn_{0.8}Mg_{0.05}Al_{0.10}O$ layer, the electron confinement effect by the conduction band and the hole confinement effect by the valence band are generated in the ZnO layer.

In the $Zn_xMg_yAl_zO$ film, when the composition ratio of Mg as the element from group IIa is larger than that of Zn as the element from group IIb ($y>x$), a crystal phase of ZnO and that of MgO separate from each other in some cases. In such cases, a transportation barrier for carriers or the like sometimes is generated, thus deteriorating the performance of the electronic device. Therefore, it is preferable to achieve a construction in which the composition ratio of the element from group IIa is smaller than that of the element from group IIb ($x>y$).

Further, when the $Zn_xMg_yAl_zO$ film has a construction in which the composition ratio of Al is smaller than the sum of the composition ratio of Zn and that of Mg ($z<(x+y)$), there are more valance electrons of Al than those of Zn and Mg in a single phase compound with a construction based on ZnO, whereby the electrical conductivity can be improved. Since the band gap of $Zn_xMg_yAl_zO$ is wide, ultraviolet light also is transmitted. Thus, using such an oxide, it is possible to obtain a transparent electrically conductive film having a wide transmission wavelength range and a low resistance.

In the low-resistance $Zn_xMg_yAl_zO$ film, it sometimes is difficult to control the carrier density by the Al content. On the other hand, when the film is doped with a slight amount of N or P, which is an element from group Vb having less valence electrons than oxygen, it is easier to control the carrier density by the dosage of N or P. Consequently, the use of such an oxide makes it possible to achieve an n-type semiconductor thin film that can be used preferably for an electronic device such as a transparent transistor.

As described above, the oxide layer formed of the oxide of the first embodiment is applicable as a transparent electrically conductive film or a semiconductor thin film of an electronic device.

Second Embodiment

In a second embodiment, an exemplary solar cell will be described as an example of the electronic device of the present invention.

Figure 2:
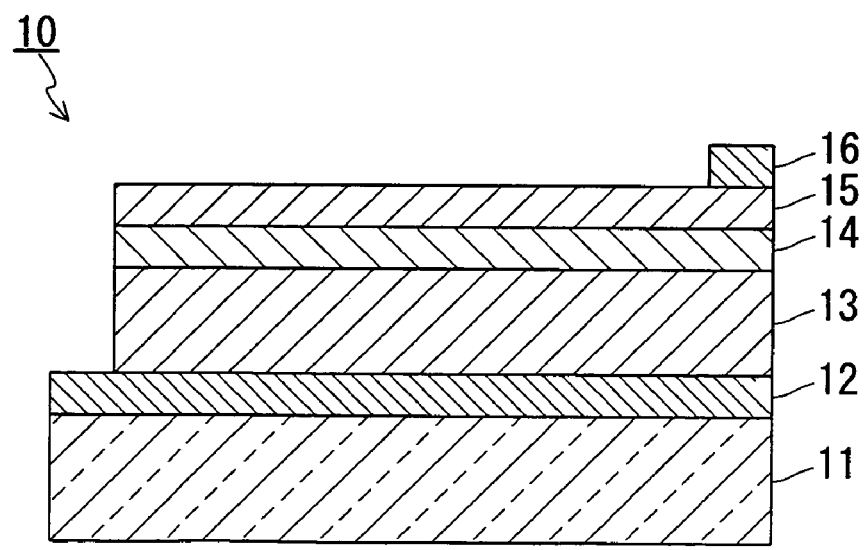
FIG. 2 is a sectional view showing an example of a solar cell of the present invention.

FIG. 2 shows a cross-section of the solar cell of the second embodiment. Referring to FIG. 2, a solar cell 10 according to the second embodiment includes a substrate 11, a back electrode (a first electrode layer) 12, a semiconductor layer 13, an oxide layer 14, a transparent electrically conductive film (a second electrode layer) 15 and a lead electrode 16. The back electrode 12, the semiconductor layer 13, the oxide layer 14 and the transparent electrically conductive film 15 are deposited on the substrate 11 in this order, and the lead electrode 16 is formed on the transparent electrically conductive film 15. Incidentally, other layers may be provided in addition to the above. For example, a second semiconductor layer may be provided between the semiconductor layer 13 and the oxide layer 14.

For the substrate 11, glass, stainless steel, polyimide or the like can be used, for example. Further, a stainless steel substrate or a glass substrate whose surface is provided with an insulating film also may be used. In particular, the stainless steel is preferable because its strength is maintained even when the substrate is made thinner.

The back electrode 12 can be formed of an electrically conductive material, which can be a metal film made of Mo, for example.

The semiconductor layer 13 functions as a light-absorption layer and can be formed of, for example, semiconductors of chalcopyrite structure whose main constituent elements are elements from groups Ib, IIIb and VIb (in the following, sometimes referred to as group I-III-VI compound semiconductors). The semiconductors of chalcopyrite structure are preferable as the light-absorption layer of the solar cell because they have a large light-absorption coefficient and can absorb solar light sufficiently with a thickness of 2 μm or less. The element from group Ib can be Cu, for example. The element from group IIIb can be at least one element selected from the group consisting of In and Ga, for example. The element from group VIb can be at least one element selected from the group consisting of Se and S. The semiconductor layer 13 can be formed of a p-type semiconductor in which the composition ratio of the elements from group Ib, group IIIb and group VIb is substantially 1:1:2, for example, $CuInSe_2$, $Cu(In, Ga)Se_2$ or a semiconductor obtained by substituting a part of Se of them with S (sulfur).

Furthermore, in the case of providing the second semiconductor layer between the semiconductor layer 13 and the oxide layer 14, this second semiconductor layer can be formed of a group I-III-VI compound semiconductor having a different composition ratio from the semiconductor layer 13. In particular, a semiconductor of defect stannite structure in which the composition ratio of the elements from group Ib, group IIIb and group VIb is substantially 1:3:5 is preferable for a solar cell because it sometimes shows n-type conduction and can form a quasi-pn homo junction with the group I-III-VI compound semiconductor showing a p-type conduction (the semiconductor layer 13).

Moreover, the second semiconductor layer also can be formed of, for example, a group I-III-VI compound semiconductor doped with an element from group IIb. Although a semiconductor of chalcopyrite structure containing the elements from group Ib, group IIIb and group VIb with a composition ratio of about 1:1:2 shows a p-type conduction, it becomes an n-type semiconductor when being doped with an element from group IIb. Accordingly, using the n-type second semiconductor layer and the p-type semiconductor layer 13 as described above, it is possible to form a pn homo junction, achieving a higher voltage solar cell. Further, when the semiconductor layer 13 is formed of the group I-III-VI compound semiconductor, the second semiconductor layer may be formed of a group I-III-VI compound semiconductor that is different from the semiconductor layer 13 only in terms of the element from group VIb. For example, when a $CuInSe_2$ layer containing the elements from group Ib, group IIIb and group VIb is used as the semiconductor layer 13 serving as the light-absorption layer, a $CuInS_2$ layer in which only an element from group VIb is different can be used as the second semiconductor layer. At this time, since $CuInS_2$ has a wider band gap and a deeper valance band level (one that is farther away from the vacuum level) than $CuInSe_2$, a barrier against holes (a hole barrier) is formed at an interface between them. This is preferable for improving an efficiency of the solar cell because this hole barrier reduces recombination at the surface (interface) of the $CuInS_2$ layer. Incidentally, the second semiconductor layer may be formed by combining the three examples described above.

For the oxide layer 14 serving as the window layer, the oxide layer described in the first embodiment can be used. Examples thereof can include oxides represented by the composition formulae: $Zn_xMg_yAl_zO$, $Zn_xMg_yGa_zO$, $Zn_xMg_yIn_zO$ and $Zn_xMg_yB_zO$. As described in the first embodiment, in these composition formulae, x, y and z satisfy $0<x<1$, $0<y<1$, $0<z<1$ and $2X+2Y+3Z\approx 2$ (this also is true to the formulae below). Also, it is possible to use oxides using a plurality of elements for at least one element from each of groups IIb, IIa and IIIb as in $(Zn, Cd)_xMg_yAl_zO$, $Zn_x(Be, Mg)_yAl_zO$ and $Zn_xMg_y(Al, Ga)_zO$. Further, an oxide doped with a slight amount of the element from group Vb, for example, $Zn_xMg_yAl_zO:N$ or the like can be used. In the case of using the semiconductor of chalcopyrite structure containing the elements from groups Ib, IIIb and VIb with a composition ratio of about 1:1:2 (for example, the semiconductor described above) for the semiconductor layer 13, it is preferable that $Zn_{0.87}Mg_{0.10}Al_{0.02}O$ or $Zn_{0.77}Mg_{0.13}Ga_{0.06}O$ or the like in particular is used as the oxide layer 14.

Here, the electrical conductivity of the oxide containing at least one element from each of group IIa, group IIb and group IIIb can be controlled by changing the composition ratio of metallic elements, the amount of oxygen deficiency and the dosage of the element from group Vb (for example, N or P) with which the oxide is doped slightly. As a result, it is possible to obtain oxide layers with various resistance values from a low-resistance oxide layer to a high-resistance oxide layer close to an insulator. Thus, the window layer suitable for improving an efficiency of the solar cell can be provided.

The transparent electrically conductive film 15 can be formed of an electrically conductive material having a light-transmitting property, for example, a film made of ITO ($In_2O_3$:Sn), ZnO:B, ZnO:Al or ZnO:Ga. It also is possible to use a layered film of two or more of these films.

The lead electrode 16 can be a metal film obtained by layering a NiCr film or a Cr film and an Al film or an Ag film, for example.

Next, an example of a method for manufacturing the solar cell 10 will be explained.

First, the back electrode 12 is formed on the substrate 11 by, for example, sputtering or vapor deposition. Thereafter, the semiconductor layer 13 is formed by, for example, vapor deposition or selenization. In the case of employing selenization, after a metal film containing at least one element from group Ib and group IIIb is formed by sputtering, this metal film is heat-treated in an atmosphere of a gas containing at least one element from group VIb (for example, $H_2Se$), thereby forming the semiconductor layer 13.

Subsequently, the oxide layer 14 formed of the oxide containing at least one element from each of group IIa, group IIb and group IIIb is formed by, for example, a manufacturing method that will be described in a third embodiment. Then, the transparent electrically conductive film 15 is formed on the oxide layer 14 by, for example, sputtering. Thereafter, the lead electrode 16 is formed by, for example, vapor deposition or printing. Incidentally, by depositing the element from group IIb or the element from group VIb on the semiconductor layer 13, the surface of the semiconductor layer 13 may be doped with the element from group IIb or group VIb so as to change this part into the second semiconductor layer, thus providing the second semiconductor layer between the semiconductor layer 13 and the oxide layer 14. In this manner, the solar cell 10 can be formed.

In the solar cell of the present invention, the oxide layer 14 is formed using the oxide containing at least one element from each of group IIa, group IIb and group IIIb. Accordingly, the electrical conductivity thereof can be controlled from low resistance to high resistance close to insulation by changing the composition ratio of metallic elements of the oxide layer 14, the amount of oxygen deficiency and the dosage of the element from group Vb with which the oxide layer 14 is doped slightly. Thus, it is possible to provide the window layer suitable for improving an efficiency of the solar cell. Further, in accordance with the present invention, the valence band level of the oxide layer 14 can be controlled by changing the content of the element from group IIIb therein, so that recombination can be reduced at the interface between the semiconductor layer 13 and the oxide layer 14, thereby increasing an open-circuit voltage of the solar cell.

It should be noted that the electronic device of the present invention is not limited to the solar cell but may be any electronic devices that use preferably the oxide layer described in the first embodiment. Examples of such electronic devices can include a light-emitting diode, a laser and a thin film transistor.

Third Embodiment

The third embodiment is directed to an example of a method for manufacturing the oxide thin film (oxide layer) described in the first and second embodiments.

In the manufacturing method of the third embodiment, an oxide thin film is produced by sputtering. As a target, an oxide sintered body containing an oxide of the element from group IIa, an oxide of the element from group IIb and an oxide of the element from group IIIb can be used, for example. The oxide sintered body can be produced by mixing oxide powder of the element from group IIa, oxide powder of the element from group IIb and oxide powder of the element from group IIIb in a predetermined ratio and then sintering them. For example, MgO, ZnO and $Al_2O_3$ are mixed in a mole ratio of 10:88:2. The oxide sintered body with this mole ratio has an electrical conductivity. Here, the sintered body does not have to be a single phase $Zn_xMg_y$-$Al_zO$.

The above-mentioned target is placed in a decompressible chamber. A substrate on which the oxide layer will be formed is placed at a position facing the target. Then, when plasma is excited in a rare gas atmosphere such as an Ar gas atmosphere while water-cooling the target of the oxide sintered body, Ar ions impact on the target so as to allow the oxide particles to fly off, so that the oxide thin film is formed on the substrate. In the case where the oxide sintered body has an electrical conductivity, direct-current sputtering can be used. In the case where the oxide sintered body is highly resistive or insulative, high-frequency sputtering can be used.

In the case where the target has an electrical conductivity, it is preferable to use direct-current sputtering. In the case where the target is insulative, high-frequency sputtering can be used. The power to be applied to the target is not particularly limited but is set according to the size of the target and the pressure inside the chamber.

Further, when an oxygen gas is introduced as the sputtering atmosphere in addition to the rare gas, it becomes possible to control the electrical conductivity of the oxide thin film by changing the partial pressure (gas ratio) of oxygen. For example, even when the target of the oxide sintered body has a low resistance, a high-resistance oxide thin film close to an insulator can be obtained by increasing the ratio of the oxygen gas to the Ar gas.

Moreover, when a $H_2O$ gas or a $D_2O$ gas is introduced as the sputtering atmosphere in addition to the rare gas (and the oxygen gas or the like), a reducing atmosphere can be obtained, so that the electrical conductivity of the oxide thin film improves.

Also, when a nitrogen gas is introduced as the sputtering atmosphere in addition to the rare gas (and the oxygen gas or the like), it becomes possible to control the electrical conductivity of the oxide thin film by changing the partial pressure (gas ratio) of the nitrogen gas. When nitrogen is mixed in, the resistance of the oxide thin film increases. For example, in the case of using a low-resistance oxide sintered body, the amount of nitrogen to be mixed into the oxide thin film can be controlled by the partial pressure of nitrogen in the sputtering gas atmosphere, allowing a precise control of the electrical conductivity. Thus, it is possible to provide the oxide thin film having a carrier density suitable for a solar cell, a light-emitting device and the like.

Although the above description has been directed to the manufacturing method using a single oxide sintered body containing the elements from group IIa, group IIb and group IIIb as the target, the oxide thin film also may be formed by sputtering using two or more targets. In such cases, it is appropriate that those targets altogether contain the oxide of at least one element from group IIa, the oxide of at least one element from group IIb and the oxide of at least one element from group IIIb. For example, a ternary target including the target of the oxide of at least one element from group IIa, the target of the oxide of at least one element from group IIb and the target of the oxide of at least one element from group IIIb may be sputtered simultaneously, thereby forming the oxide thin film of the first and second embodiments. In this case, by changing the electric power applied to the three targets, it is possible to control the composition ratio of the elements of group IIa, group IIb and group IIIb over a wide range. Furthermore, a binary target including the oxide target of at least one element from group IIa and the oxide target of at least one element from each of group IIb and group IIIb also may be sputtered simultaneously, thereby forming the oxide thin film of the first and second embodiments. In this case, since $ZnO:Al_2O_3$, $ZnO:Ga_2O_3$ or the like, which is the target of the oxide containing the elements from group IIb and group IIIb, for example, has a low resistance, direct-current sputtering can be employed.

In accordance with the manufacturing method of the third embodiment, it is possible to produce an oxide thin film that has a desired electrical conductivity and is formed of an oxide containing at least one element from each of group IIa, group IIb and group IIIb.

EXAMPLE

The following is a more specific description of the present invention by way of examples.

Example 1

Example 1 is directed to an example of manufacturing the oxide thin film described in the first embodiment by the method according to the third embodiment.

A target formed of an oxide sintered body was placed in a vacuum chamber, and a glass substrate was disposed so as to face the target. The oxide sintered body was produced by mixing MgO powder, ZnO powder and $Al_2O_3$ powder in a mole ratio of 10:88:2 and then sintering the mixture. This oxide sintered body had an electrical conductivity. Next, Ar gas and $O_2$ gas were introduced into the vacuum chamber, and a direct-current voltage was applied to the oxide target so as to generate a discharge, thereby depositing an oxide thin film on the glass substrate. At this time, the gas pressure was 1 Pa, and the applied direct-current electric power was 1 kW. During the oxide thin film formation, the holding stand for the glass substrate was water-cooled so as to keep the temperature of the glass substrate at about a room temperature. In Example 1, several kinds of the oxide thin films were produced by changing the flow ratio of the Ar gas and the $O_2$ gas. The sheet resistance of the obtained oxide thin films was measured.

Figure 3:
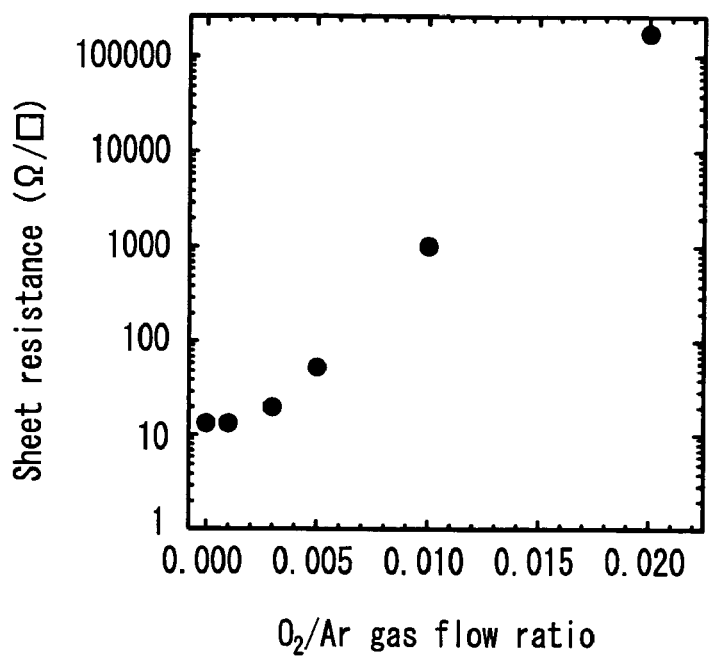
FIG. 3 is a graph showing the relationship between a sheet resistance of a $Zn_xMg_yAl_zO$ film formed by a manufacturing method of the present invention and a flow ratio of an $O_2$ gas to an Ar gas ($O_2$/Ar) during film forming.

FIG. 3 shows the change in the sheet resistance of the oxide thin film ($Zn_{0.86}Mg_{0.10}Al_{0.04}O$) with respect to the flow ratio of the Ar gas to the $O_2$ gas. The oxide thin films had a thickness of about 1.0 µm regardless of their flow ratio. The sheet resistance increased in keeping with the flow ratio of the $O_2$ gas. Since the oxide thin films all had the same thickness, the change in the sheet resistance corresponded to the change in the specific resistance of the oxide thin films. As a result, it was found that the electrical conductivity of the oxide thin films could be controlled by changing the flow ratio of the $O_2$ gas.

Furthermore, by using a sputtering gas prepared by introducing $H_2O$ gas in the above-noted sputtering gas (the flow ratio: $H_2O$ gas/Ar gas=0.04), a low-resistance $Zn_x Mg_y Al_z O$ film with a sheet resistance of about 10 Ω/sq. (sheet resistance [Ω/sq.]=volume resistivity [Ω·cm]/thickness [cm]) was obtained in the case where the flow ratio of $O_2$ gas/Ar gas was 0.02 or smaller. Accordingly, the introduction of the $H_2O$ gas in the sputtering gas allowed the low-resistance $Zn_xMg_yAl_zO$ film to be formed over a wide range of the $O_2$ flow ratio. As a result, it became possible to suppress non-uniformity of the electrical conductivity within the surface owing to non-uniform $O_2$ flow ratio. In other words, the uniformity of the sheet resistance of the oxide thin film in a large area and its reproducibility improved.

Moreover, an oxide thin film was produced by fixing the flow ratio of the $O_2$ gas to the Ar gas in the above-noted sputtering gas to 0.001 and further introducing $N_2$ gas therein. In this case, until the flow ratio of $N_2$ gas/Ar gas reached 0.1, it was observed that the sheet resistance of the oxide thin film increased from about 10 Ω/sq. to 10 kΩ/sq. in logarithmic proportion to the flow ratio of the $N_2$ gas. This is considered to be because nitrogen, an element from group Vb, with which the film was doped compensated for (canceled out) donors caused by deficiencies of elements from group IIIb and oxygen. Since the sheet resistance can be controlled by introducing the $N_2$ gas in a flow ratio larger than that of the $O_2$ gas and the Ar gas by an order of magnitude, it is possible to control the electrical conductivity (carrier density) precisely. Thus, according to the present invention, it is possible to provide a transparent oxide thin film suitable for an electronic device.

Although Al was used as the element from group IIIb of the oxide sintered body in the present example, a similar effect can be obtained when using Ga or In. Further, although Mg was used as the element from group IIa of the oxide sintered body here, a similar effect can be obtained when using Be, Ca, Sr or Ba. Also, a similar effect can be obtained when using a $D_2O$ gas instead of the $H_2O$ gas of the present example. In the case of the $D_2O$ gas, the electron temperature of the plasma is lower, thus producing an effect of reducing damages to an oxide thin film to be formed. Moreover, although nitrogen was used as the element from group Vb in the present example, a similar effect can be obtained also by, for example, a method of adding oxide powder containing an element from group Vb such as $P_2O_5$ to the oxide sintered body so as to dope the oxide thin film.

Example 2

Example 2 is directed to another example of manufacturing the oxide thin film of the first embodiment by the method according to the third embodiment.

In a manner similar to that in Example 1, a target formed of an oxide sintered body was placed in a vacuum chamber, and a glass substrate was disposed so as to face the target. The oxide sintered body was produced by sintering MgO powder, ZnO powder and $Ga_2O_3$ powder. At this time, the mole ratio of MgO to ZnO was fixed to about 1:9, and the amount of $Ga_2O_3$ powder to be added was changed. In Example 2, the flow ratio of the $O_2$ gas to the Ar gas was fixed to 0.001, and direct-current sputtering was carried out under the same condition as that in Example 1, thus producing a $Zn_xMg_yGa_zO$ film (x:y=9:1). Then, using targets with different amounts of $Ga_2O_3$ powder to be added, a plurality of $Zn_xMg_yGa_zO$ films were formed.

Figure 4:
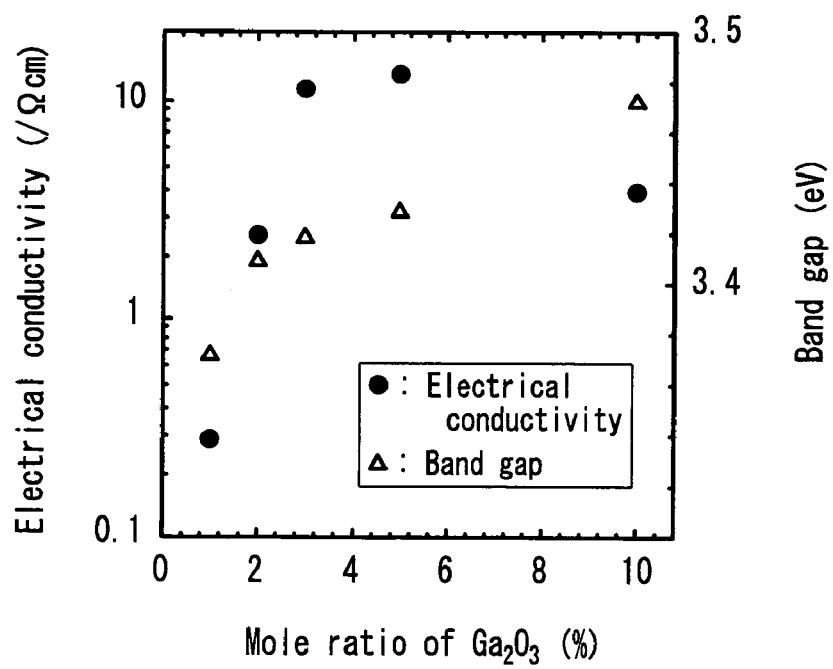
FIG. 4 is a graph showing the relationship between a mole ratio of $Ga_2O_3$ added to a target and an electrical conductivity and a band gap of a formed $Zn_xMg_yGa_zO$ film.

FIG. 4 shows the change in an electrical conductivity and a band gap with respect to the amount (mole ratio) of $Ga_2O_3$ added to the oxide sintered body. In the range where the mole ratio of $Ga_2O_3$ was not greater than 3%, the electrical conductivity increased in keeping with the added amount of $Ga_2O_3$. Then, the electrical conductivity was the highest from 3% to 5% mole ratio. When the mole ratio of $Ga_2O_3$ was raised up to 10%, the electrical conductivity dropped. Thus, in order to achieve a low-resistance $Zn_xMg_yGa_zO$ film, it is appropriate to set the mole ratio of $Ga_2O_3$ added to the oxide sintered body used as the target to about 3% to 5%.

On the other hand, when the target with a 1% mole ratio of $Ga_2O_3$ was replaced with the target with a 2% mole ratio thereof, the band gap of the obtained oxide thin film widened slightly. Also, in the range from 2% to 5% mole ratio, the band gap was substantially constant irrespective of the added amount of $Ga_2O_3$. When the amount of $Ga_2O_3$ was increased until the mole ratio reached 10%, the band gap expanded. When the mole ratio is not greater than 5%, it is considered that the band gap hardly changes because $Ga_2O_3$ serves as a dopant. On the other hand, when the amount of $Ga_2O_3$ is increased until the mole ratio reached 10%, it is considered that the expansion of the band gap is due to the fact that the valence band level in a band structure of the $Zn_xMg_yGa_zO$ film becomes deeper with respect to the vacuum level.

Moreover, a $Zn_xMg_yGa_zO$ film was produced using a target of an oxide sintered body to which at least 25% by mole ratio of $Ga_2O_3$ was added. In this case, z>0.5, and when the resultant film was measured by X-ray diffraction, a diffraction peak from the structure based on ZnO and a diffraction peak from the structure based on $ZnGa_2O_4$ were observed. In other words, it was found that there were two compound phases mixed in the resultant film. Thus, a single-phase $Zn_xMg_yGa_zO$ film was not formed.

Additionally, an oxide sintered body target in which the mole ratio of MgO powder was larger than that of ZnO powder, more specifically, a target with MgO:ZnO=6:4 (mole ratio) was prepared so as to produce a $Zn_xMg_yGa_zO$ film. When this film was measured by X-ray diffraction, a diffraction peak from the structure based on ZnO and a diffraction peak from the structure based on MgO were observed, so as to find that there were two compound phases mixed in the film. Thus, a single-phase $Zn_xMg_yGa_zO$ film was not formed.

According to the method in Example 2, it was possible to control the electrical conductivity and the band gap of the oxide thin film to be formed by the composition ratio of the oxide sintered body used for the target. As described above, the present invention can provide a transparent oxide thin film suitable for electronic devices such as a solar cell and a light-emitting element.

Example 2 has been directed to the manufacturing method using a single target containing Zn, Mg and Ga. However, a similar $Zn_xMg_yGa_zO$ thin film can be formed by, for example, simultaneously sputtering a ternary target including a MgO target, a ZnO target and a $Ga_2O_3$ target. In this case, since the three targets are insulators, it is necessary to employ high-frequency sputtering. Further, a similar $Zn_xMg_yGa_zO$ thin film also can be formed by, for example, simultaneous sputtering using a binary target including a MgO target and a $ZnO:Ga_2O_3$ target. In this case, since $ZnO:Ga_2O_3$ has a low resistance, direct-current sputtering can be employed. Thus, it is possible to form an oxide thin film by performing high-frequency sputtering using a MgO target and direct-current sputtering using a $ZnO:Ga_2O_3$ target simultaneously.

Example 3

In Example 3, an example of producing the solar cell of the second embodiment will be described.

Figure 5:
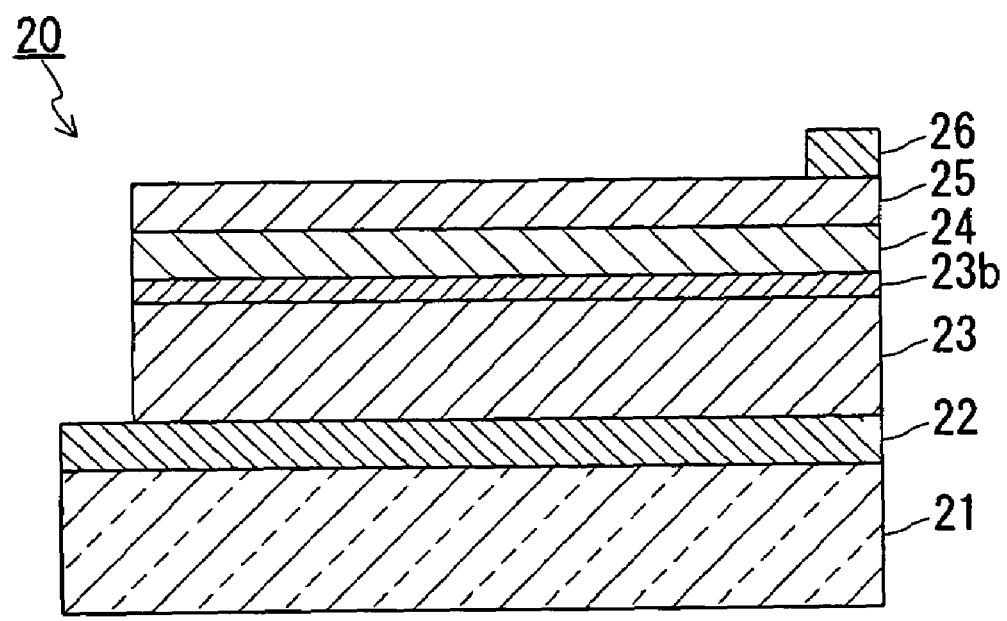
FIG. 5 is a sectional view showing another example of the solar cell of the present invention.

The forming method will be explained referring to FIG. 5. Soda-lime glass was used as a substrate 21. On this substrate 21, a Mo film serving as a back electrode (a first electrode layer) 22 was formed by sputtering. The thickness of the Mo film was about 0.4 μm. Next, as a semiconductor layer 23 serving as a light-absorption layer, a Cu(In, Ga)Se$_2$ (CIGS) thin film was formed by vapor deposition. The thickness of the CIGS film was about 2 μm. Then, Zn was deposited and diffused on the surface of the CIGS film while heating the CIGS film, thereby doping the surface of the CIGS film with Zn. In this manner, a Cu(In, Ga)Se$_2$:Zn layer serving as a second semiconductor layer 23b was formed on the surface of the semiconductor layer 23. The diffusion depth of Zn was about 50 nm. Subsequently, on the Cu(In, Ga)Se$_2$:Zn layer, a $Zn_xMg_yAl_zO$ film (x:y:z=0.86:0.10:0.04) was formed as an oxide layer 24 by a method similar to that in Example 1. However, unlike Example 1, the gas pressure was set to be 2.5 Pa, and the flow ratio of the $O_2$ gas to the Ar gas was set to be 0.02. The resultant $Zn_xMg_yAl_zO$ film had a thickness of about 0.1 μm. As becomes clear from FIG. 3, this $Zn_xMg_yAl_zO$ film was a high-resistance film close to an insulator. Thereafter, an ITO film with a thickness of about 0.1 μm serving as a transparent electrically conductive film (a second electrode layer) 25 was formed by sputtering. Finally, a layered film of a NiCr film and an Al film serving as a lead electrode 26 was formed by electron-beam evaporation using a shadow mask. In this manner, the solar cell of the second embodiment was produced.

In Example 3, how the film forming speed of the oxide layer 24 changed depending on the kinds of sputtering was evaluated. More specifically, the $Zn_xMg_yO$ film was formed by high-frequency sputtering instead of the above-mentioned direct-current sputtering, and its film forming speed was calculated. The high-frequency sputtering was carried out using as a target an oxide sintered body of $Zn_xMg_yO$ (x:y=0.9:0.1) in which the composition ratios of the element from group IIb and the element from group IIa were substantially equal, thus forming a $Zn_xMg_yO$ film with a thickness of 0.1 μm. The electric power to be applied was the same as that for the above-described direct-current sputtering. It was then found that, by forming the oxide thin film by direct-current sputtering using the $Zn_xMg_yAl_zO$ sintered body target having an electrical conductivity, the film forming speed was 7 times faster than that of the high-frequency sputtering. Thus, by using the direct-current sputtering, it is possible to raise the speed of manufacturing process for the solar cell.

The characteristics of the solar cell of Example 3 and a solar cell of a Comparative Example were measured using pseudo-solar light with a light intensity of 100 mW/cm$^2$. The solar cell of Comparative Example was the same as the solar cell of Example 3 except that the oxide layer 24 was replaced with a ZnO film with a thickness of 0.1 μm. This ZnO film was formed by high-frequency sputtering. In the solar cell of Example 3, when the open-circuit voltage Voc=0.583 V, the short-circuit current density Jsc=36.6 mA/cm$^2$ and the fill factor FF=0.683, the conversion efficiency of 14.6% was achieved. On the other hand, in the conventional solar cell, when the open-circuit voltage Voc=0.399 V, the short-circuit current density Jsc=36.3 mA/cm$^2$ and the fill factor FF=0.488, the conversion efficiency was 7.1%. The use of the $Zn_xMg_yAl_zO$ film allowed the valence band level to be matched with that of the CIGS film, thus reducing recombination at the interface between the $Zn_xMg_yAl_zO$ film and the CIGS:Zn layer, causing an increase in the open-circuit voltage and the fill factor.

According to the present invention, the composition ratio of the elements from group IIa, group IIb and group IIIb is changed, thereby controlling the conduction band level of the oxide thin film. Thus, the conduction band levels can be matched between the window layer and the semiconductor thin film serving as the light-absorption layer, for example, the CIGS film or the second semiconductor layer CIGS: Zn, so that the recombination at the interface decreases. Consequently, by using the oxide thin film containing at least one element from each of group IIa, group IIb and group IIIb as illustrated in the present example, a solar cell having a high conversion efficiency can be obtained.

Exemplary embodiments of the present invention have been described above. However, the present invention is not limited to the above-described embodiments but can be applied to other embodiments based on the technical idea of the present invention.

For example, the above examples illustrate an exemplary solar cell using the semiconductor containing at least one element from each of group Ib, group IIIb and group VIb as the light-absorption layer. However, the present invention is not limited to this, but the oxide thin film of the present invention also can be used for a transparent interlayer between a pin junction amorphous Si solar cell and a pin junction microcrystalline Si solar cell in a solar cell in which the amorphous Si solar cell and the microcrystalline Si solar cell are layered. In this case, since photoexcited electrons flow from the amorphous Si to the microcrystalline Si, the transparent interlayer has to have a suitable electrical conductivity, and the oxide thin film of the present invention is preferable because its electrical conductivity can be controlled. In particular, attenuation of infrared light owing to free carrier absorption needs to be suppressed in order to allow more infrared light to enter the microcrystalline Si solar cell, and it is thus preferable to use the oxide thin film of the present invention that can control the carrier density to a suitable level. Furthermore, in response to a demand for wide band gap for the transparent interlayer, the oxide thin film of the present invention is preferable because its band gap can be expanded by changing the composition ratio of the elements from group IIa, group IIb and group IIIb.

As described above, the electrical conductivity (carrier density) and the band gap of the oxide thin film used in the present invention can be controlled by changing the composition ratio of the elements from group IIa, group IIb and group IIIb. Therefore, the oxide thin film of the present invention is preferable as a material of a thin film requiring a desired carrier density and a desired band gap, namely, a thin film of an electronic device. By using such an oxide thin film, it is possible to achieve an electronic device with excellent characteristics. Especially when this oxide thin film is used as a window layer of a solar cell, the conduction band levels can be matched between the window layer and the semiconductor layer serving as a light-absorption layer, so that a solar cell having a high energy conversion ratio can be provided. Furthermore, according to the method for manufacturing an electronic device in the present invention, it is easy to form the oxide thin film used in the present invention. In particular, by changing the constituent ratio (flow ratio) of the sputtering gas, the electrical conductivity (carrier density) of the oxide thin film etc. can be controlled precisely. In addition, by using the oxide sintered body target having an electrical conductivity, it becomes possible to manufacture the oxide thin film by direct-current sputtering, allowing a high-speed oxide thin film formation.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. An electronic device comprising:
   an oxide layer;
   a first electrode layer;
   a second electrode layer having a light-transmitting property; and
   a semiconductor layer being provided between the first electrode layer and the second electrode layer and functioning as a light-absorption layer,
   wherein the oxide layer comprises an oxide comprising an element from group IIa, an element from group IIb and an element from group IIIb, and
   the oxide layer is provided between the semiconductor layer and the second electrode layer, and the electronic device functions as a solar cell.

2. The electronic device according to claim 1, wherein the element from group IIa in the oxide is at least one element selected from the group consisting of Be, Mg, Ca, Sr and Ba, the element from group IIb in the oxide is Zn, and the element from group IIIb in the oxide is at least one element selected from the group consisting of B, Al, Ga and In.

3. The electronic device according to claim 2, wherein a composition ratio of the element from group IIIb in the oxide is smaller than a sum of a composition ratio of the element from group IIa and that of the element from group IIb in the oxide.

4. The electronic device according to claim 3, wherein the composition ratio of the element from group IIa in the oxide is smaller than that of the element from group IIb in the oxide.

5. The electronic device according to claim 2, wherein a composition ratio of the element from group IIa in the oxide is smaller than that of the element from group IIb in the oxide.

6. The electronic device according to claim 1, wherein the oxide further comprises an element from group Vb.

7. The electronic device according to claim 1, wherein the semiconductor layer comprises a semiconductor whose main constituent elements are an element from group Ib, an element from group IIIb and an element from group VIb, and the semiconductor layer and the oxide layer are layered.

* * * * *